US006650512B1

United States Patent
Gill

(10) Patent No.: US 6,650,512 B1
(45) Date of Patent: Nov. 18, 2003

(54) GMR COEFFICIENT ENHANCEMENT OF A SPIN VALVE STRUCTURE

(75) Inventor: Hardayal Singh Gill, Portola Valley, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/532,000

(22) Filed: Mar. 21, 2000

(51) Int. Cl.[7] ................................................ G11B 5/39
(52) U.S. Cl. .................................................. 360/324.12
(58) Field of Search ...................... 360/324.12, 324.11, 360/324.1, 324

(56) References Cited

U.S. PATENT DOCUMENTS

| | | | | |
|---|---|---|---|---|
| 4,782,413 A | | 11/1988 | Howard et al. ............ 360/113 |
| 5,508,866 A | | 4/1996 | Gill et al. .................. 360/113 |
| 5,589,278 A | | 12/1996 | Kamijo ...................... 428/611 |
| 5,818,684 A | | 10/1998 | Iwasaki et al. ............ 360/113 |
| 5,923,505 A | | 7/1999 | Kroes et al. ............... 360/113 |
| 6,134,090 A | * | 10/2000 | Mao et al. ................ 360/324.1 |
| 6,154,349 A | * | 11/2000 | Kanai et al. ............. 360/324.12 |
| 6,175,475 B1 | | 1/2001 | Lin et al. ................. 360/324.11 |
| 6,222,707 B1 | * | 4/2001 | Huai et al. ................ 360/324.1 |
| 6,278,592 B1 | * | 8/2001 | Xue et al. ............... 360/324.12 |
| 6,282,068 B1 | | 8/2001 | Pinarbasi ................ 360/324.11 |
| 6,295,187 B1 | * | 9/2001 | Pinarbasi ................ 360/324.11 |
| 6,322,911 B1 | * | 11/2001 | Fukagawa et al. ......... 428/692 |
| 6,338,899 B1 | * | 1/2002 | Fukuzawa et al. ......... 428/332 |
| 6,395,388 B1 | * | 5/2002 | Iwasaki et al. ............ 428/332 |
| 6,433,972 B1 | * | 8/2002 | Mao et al. .............. 360/324.11 |
| 6,466,418 B1 | * | 10/2002 | Horng et al. ............ 360/324.12 |
| 6,490,140 B1 | * | 12/2002 | Mao et al. .............. 360/324.11 |
| 6,498,707 B1 | * | 12/2002 | Gao et al. ............... 360/324.11 |

FOREIGN PATENT DOCUMENTS

| | | | |
|---|---|---|---|
| GB | 2349735 A | 8/2000 | ............ G11B/5/39 |
| JP | 410021512a | 1/1998 | |
| JP | 410154618a | 6/1998 | |
| JP | 410261824a | 9/1998 | |
| JP | 410312512a | 11/1998 | |
| JP | 411054323a | 2/1999 | |
| JP | 2001202206 A | 7/2001 | ............ G06F/3/08 |

OTHER PUBLICATIONS

Cho et al. *Effect of Seed Layer on the Magnetoresistance Characteristics in a–CoNbZr–Based Spin Valves*IEEE Transactions on Magnetics, vol. 34, No. 4 Jul. 1998 pp. 1414–1416.

* cited by examiner

Primary Examiner—William Korzuch
Assistant Examiner—Angel Castro
(74) Attorney, Agent, or Firm—Kunzler & Associates

(57) ABSTRACT

A bottom structure for a spin valve sensor is configured to provide an increased GMR coefficient through the use of a crystallographically aligned seed layer in one embodiment and an improved pinned layer in a further embodiment. This improvement occurs through the avoidance of current shunting of the sensing layers, softening of sensing and pinned layers through even layer texturing, and a stronger coupling between the antiferromagnetic and pinned layers. The improved seed layer of the present invention may be formed with a face-centered cubic (FCC) material having a (111) crystallographic plane parallel to an underlying substrate. One preferred material for use in the seed layer is $Ni_{42}Fe_{50}Nb_8$.

23 Claims, 7 Drawing Sheets

GMR COEFFICIENT ENHANCEMENT OF A SPIN VALVE STRUCTURE

BACKGROUND OF THE INVENTION

1. The Field of the Invention

The present invention relates generally to spin valve magnetic transducers for reading information signals from a magnetic medium and, in particular, to novel structures for a spin valve sensor, and to magnetic recording systems which incorporate such sensors.

2. The Relevant Technology

Computer systems generally utilize auxiliary memory storage devices having media on which data can be written and from which data can be read for later use. A direct access storage device, such as a disk drive, incorporating rotating magnetic disks is commonly used for storing data in magnetic form on the disk surfaces. Data is recorded on concentric, radially spaced tracks on the disk surfaces. Magnetic heads carrying read sensors are then used to read data from the tracks on the disk surfaces.

In high capacity disk drives, magnetoresistive read sensors, commonly referred to as MR heads, are now the most common type of read sensors. This is largely due to the capability of MR heads of reading data on a disk of a greater linear density than that which the previously used thin film inductive heads are capable of. An MR sensor detects a magnetic field through a change in resistance in its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization of the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material separated by a layer of non-magnetic electrically conductive material are generally referred to as spin valve (SV) sensors manifesting the GMR effect. In an SV sensor, one of the ferromagnetic layers, referred to as the pinned layer, has its magnetization typically pinned by exchange coupling with an antiferromagnetic (e.g., NiO or Fe—Mn) layer.

The magnetization of the other ferromagnetic layer, referred to as the free layer, however, is not fixed and is free to rotate in response to the field from the recorded magnetic medium (the signal field). In SV sensors, the SV effect varies as the cosine of the angle between the magnetization of the pinned layer and the magnetization of the free layer. Recorded data can be read from a magnetic medium because the external magnetic field from the recorded magnetic medium causes a change in the direction of magnetization in the free layer, which in turn causes a change in resistance of the SV sensor and a corresponding change in the sensed current or voltage. It should be noted that the AMR effect is also present in the SV sensor free layer and it tends to reduce the overall GMR effect.

FIG. 1 shows a typical prior art SV sensor 100 comprising a pair of end regions 104 and 106 separated by a central region 102. The central region 102 is formed by a suitable method such as sputtering and has defined end regions that are contiguous with and abut the edges of the central region. A free layer (free ferromagnetic layer) 110 is separated from a pinned layer (pinned ferromagnetic layer) 120 by a non-magnetic, electrically-conducting spacer layer 115. The magnetization of the pinned layer 120 is fixed through exchange coupling with an antiferromagnetic (AFM) layer 121.

The free layer 110, spacer layer 115, pinned layer 120 and AFM layer 121 are all formed in the central region 102. Hard bias layers 130 and 135 formed in the end regions 104 and 106, respectively, provide longitudinal bias for the free layer 110. Leads 140 and 145 formed over hard bias layers 130 and 135, respectively, provide electrical connections for the flow of the sensing current I, from a current source 160 to the MR sensor 100. A sensing device 170 connected to the leads 140 and 145 senses the change in the resistance due to changes induced in the free layer 110 by an external magnetic field (e.g., a field generated by a data bit stored on a disk). IBM's U.S. Pat. No. 5,206,590 granted to Dieny et al. and incorporated herein by reference, discloses an MR sensor operating on the basis of the SV effect.

Another type of spin valve sensor recently developed is an antiparallel (AP)-pinned spin valve sensor. FIG. 2 shows one representative AP-pinned SV sensor 200. The AP-pinned SV sensor 200 has a pair of end regions 202 and 204 separated from each other by a central region 206. The AP-pinned SV sensor 200 is also shown comprising a Ni—Fe free layer 225 separated from a laminated AP-pinned layer 210 by a copper spacer layer 220. The magnetization of the laminated AP-pinned layer 210 is fixed by an AFM layer 208 which is made of NiO.

The laminated AP-pinned layer 210 includes a first ferromagnetic layer 212 of cobalt and a second ferromagnetic layer 216 of cobalt separated from each other by a ruthenium (Ru) antiparallel coupling layer 214. The AFM layer 208, AP-pinned layer 210, copper spacer 220, free layer 225 and a cap layer 230 are all formed sequentially in the central region 206. A pair of hard bias layers 235 and 240, formed in the end regions 202 and 204, provide longitudinal biasing for the free layer 225.

A pair of electrical leads 245 and 250 are also formed in end regions 202 and 204, respectively, to provide electrical current from a current source (not shown) to the SV sensor 200. In the depicted example, the magnetization direction of the free layer 225 is set parallel to the air bearing surface (ABS) in the absence of an external field. The magnetization directions of the pinned layers 212 and 216, respectively, are also set to be perpendicular to the ABS. The magnetization directions of the pinned layers are shown as coming out of the Figure at 260 and going in at 255. The magnetization of the free layer 225 is shown set to be parallel to the ABS.

The disk drive industry has been engaged in an ongoing effort to increase the overall sensitivity, or GMR coefficient, of the SV sensors in order to permit the drive head to read smaller changes in magnetic flux. Higher GMR coefficients enable the storage of more bits of information on any given disk surface. The GMR coefficient of an SV sensor is ΔR/R, or the change in magnetoresistance of the sensor material, divided by the overall resistance of the material. The GMR coefficient is dependent on both the "softness" of the material and its overall resistance.

The softness of an SV sensor is a measurement of the threshold level of a magnetic field needed to change the magnetoresistance of a material by a given amount, typically that required to move the magnetic moment of the material from one orientation to another, offset from the first by 90°. The softness of a material is referred to as its coercivity, $H_c$, when the material exhibits domain walls, and more generally, by the property magnetocrystalline anisotropy, $H_K$. The change in magnetoresistance, ΔR, is proportional to the change in magnetic flux multiplied by the softness of the material. A high degree of softness is increasingly important as disk drive densities increase and the magnetic field strengths of the recorded materials correspondingly decrease.

A change in resistance of the sensor material can be easily measured only if the change is large compared to the overall resistance R of the material. Thus, a low overall resistance R, combined with a high change in magnetoresistance, ΔR, will produce a high GMR coefficient.

Other properties relevant to the performance of a GMR head include magnetostriction, exchange coupling between the AFM and the pinned layer or layers, and the electrical resistivity of the AFM. Magnetostriction is a measure of the stress or deformation of a material when it undergoes a change in magnetism. It is desired in the construction of spin valves to keep magnetostriction to a minimum because deformation of the GMR head materials can cause poor interfacing between layers and nonlinear performance as magnetic flux changes.

Exchange coupling between the AFM and the pinned layers is important because magnetic flux from the AFM must reach the pinned layer with a minimum of reluctance or leakage in order to keep the magnetic moment of the pinned layer at a consistent orientation. An inadequate exchange coupling may cause poor pinning, thereby reducing the sensitivity of the GMR head.

It is also vital that the current through the spin valve sensor be confined to the pinned and sensing portions of the spin valve sensor. If current is permitted to shunt through the AFM layer, the magnetoresistance recorded by the sensor will be artificially low, thus producing a lower GMR coefficient and a nonlinear signal. Thus, the material selected for the AFM layer must possess a high electrical resistivity in order to prevent shunting.

Drive heads have been produced by forming a seed or buffer layer on or near the substrate, and then forming the remaining layers on top of the seed layer. The crystalline structure and orientation of the seed layer determine the configuration of the remaining layers. Materials such as NiFe have previously been used to form all or part of the seed layer.

Unfortunately, bottom layers used in the past tend to form along uneven crystallographic planes, sometimes even producing a jagged interface with a mixture of nonparallel planes. Consequently, the atoms that form the boundary of the seed layer are spread far apart, and layers formed above the seed layer exhibit an uneven texture and weak bonding. The result is a lower magnetic softness and poor exchange coupling between the AFM and the pinned layer or layers.

It is believed by the inventor that providing a seed layer with a denser and more homogeneous boundary would promote even-textured growth of the layers above it, as well as tight interfaces between adjacent layers. Thus, the GMR coefficient of the spin valve sensor would be enhanced by the higher softness and lower resistance to current movement between the sensing layers. In addition, the exchange coupling between the AFM and the pinned layer or layers would be improved for a further boost in magnetic sensitivity.

The selection of structures used to produce the pinned layer or layers is also believed to be critical. NiFe is also used in many prior art pinned layers. Many currently used pinned layers provide no significant barrier to electrical current. Thus, the electrical resistance of materials such as NiFe is generally inadequate to prevent current shunting. As a result, current that should encounter higher resistance as it travels through the sensing layer and the pinned layer or layers is permitted to take a "shortcut" through the AFM. Accordingly, ΔR decreases and causes a corresponding decline in the GMR coefficient.

Therefore, It would also be desirable to form a layer above the AFM that has a high electrical resistance. Such a layer would prevent current shunting and ensure that ΔR remains highly sensitive to changes in magnetic flux, thus further improving the GMR coefficient.

OBJECTS AND BRIEF SUMMARY OF THE INVENTION

The apparatus of the present invention has been developed in response to the present state of the art, and in particular, in response to the problems and needs in the art that have not yet been fully solved by currently available spin valve sensors. Thus, it is an overall objective of the present invention to provide an improved spin valve sensor that overcomes some or all of the problems discussed above as existing in the art.

To achieve the foregoing object, and in accordance with the invention as embodied and broadly described herein in the preferred embodiments, a spin valve sensor is provided and configured with a bottom structure enhanced through the addition of one or more crystallographically aligned, electrically resistive layers.

The spin valve sensor of the present invention in one embodiment comprises a seed layer including a layer of NiFeNb and a layer of metal oxide, such as NiO. In alternate embodiments of the invention, a layer of a heavy metal, such as Ta, may be sandwiched between the NiFeNb and metal oxide layers, as part of the seed layer.

Selected embodiments provide a layer of NiFeNb within the pinned layer. In this configuration, the NiFeNb layer acts as a high resistivity buffer layer for layers underneath. This high resistivity buffer layer may be provided with or without the use of NiFeNb in the seed layer.

The spin valve sensor may comprise a cap layer, a free layer, a spacer layer, a pinned layer of ferromagnetic material as discussed above, an antiferromagnetic (AFM) layer, and a substrate. Nevertheless, the seed and high resistivity buffer layers of the present invention are intended for use with any type of spin valve sensor having a suitable construction.

The spin valve sensor of the present invention may be incorporated within a disk drive system comprising a magnetic recording disk; an anti-parallel (AP)-pinned spin valve (SV) sensor configured in the manner discussed above; an actuator for moving the spin valve sensor across the magnetic recording disk so the spin valve sensor may access different regions of magnetically recorded data on the magnetic recording disk; and a detector electrically coupled to the spin valve sensor for detecting changes in resistance of the sensor caused by rotation of the magnetization axis of the free ferromagnetic layer relative to the fixed magnetizations of the AP-pinned layer in response to magnetic fields from the magnetically recorded data.

These and other objects, features, and advantages of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained will be readily understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 3:
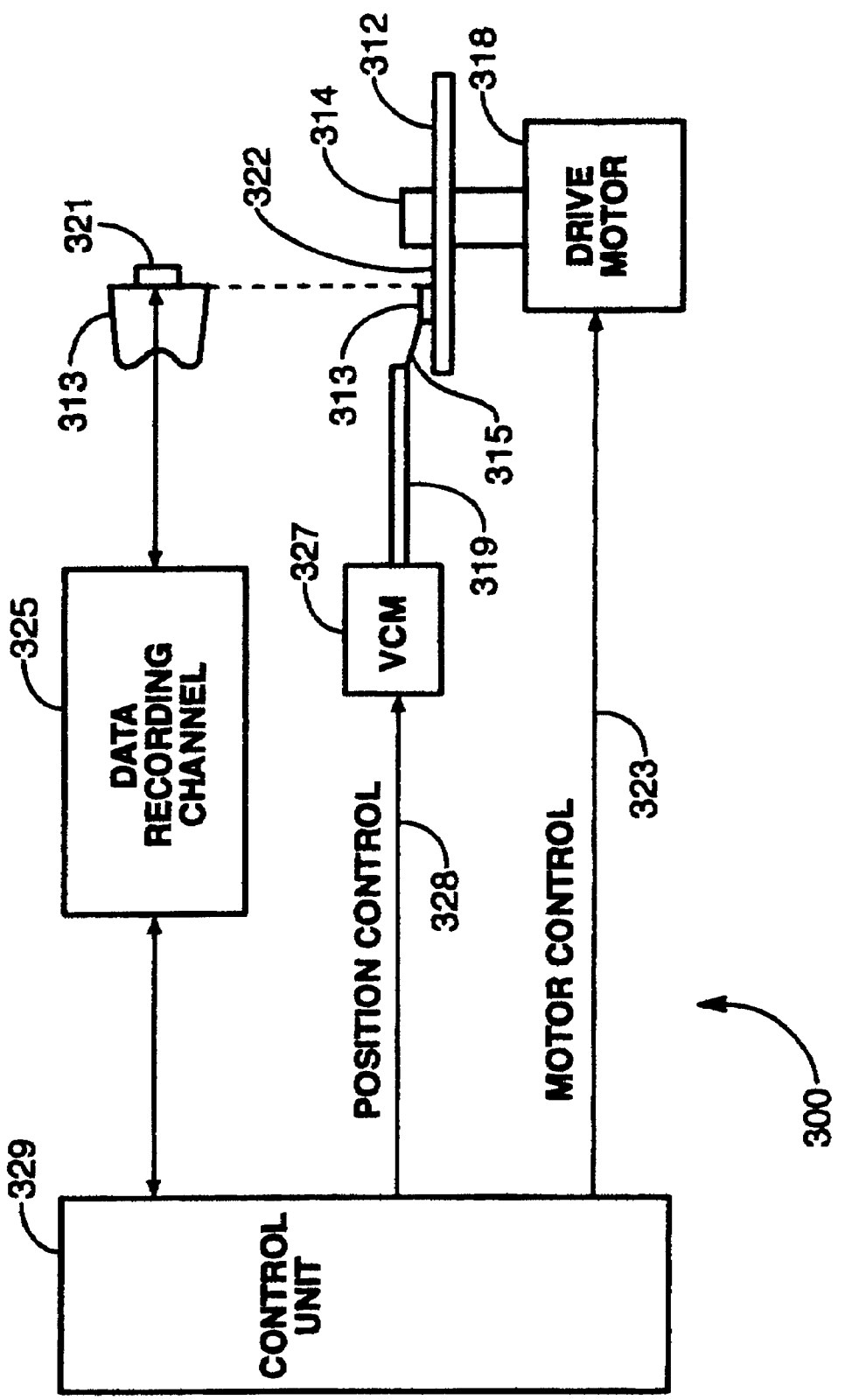
FIG. 3 is a schematic block diagram illustrating one embodiment of a magnetic recording disk drive system of the present invention.

FIG. 3 shows one example of a disk drive 300 embodying the present invention. As shown in FIG. 3, the disk drive 300 comprises at least one rotatable magnetic disk 312 supported on a spindle 314 and rotated by a disk drive motor 318. The magnetic recording media on each magnetic disk 312 is in the form of concentric, annular data tracks (not shown).

At least one slider 313 is positioned on the disk 312. Each slider 313 supports one or more magnetic read/write heads 321 incorporating the GMR sensor of the present invention. As the disks rotate, the slider 313 is moved radially in and out over the disk surface 322 so that the heads 321 may access different portions of the magnetic disk 312 where desired data is recorded. Each slider 313 is attached to an actuator arm 319 by means of a suspension 315. The suspension 315 provides a slight spring force which biases the slider 313 against the disk surface 322. Each actuator arm 319 is attached to an actuator means 327.

The actuator means as shown in FIG. 3 may be a voice coil motor (VCM). The VCM comprises a coil movable within a fixed magnetic field, and the direction and speed of the coil movements are controlled by the motor current signals supplied by a controller 329.

During operation of the disk storage system, the rotation of the magnetic disk 312 generates an air bearing between the slider 313 (the surface of the slider 313, which includes head 321 and faces the surface of disk 312, is referred to as an air bearing surface (ABS)) and the disk surface 322 which exerts an upward force or lift on the slider 313. The air bearing thus counter-balances the slight spring force of the suspension 315 and supports the slider 313 off and slightly above the disk surface by a small, substantially constant spacing during normal operation.

The various components of the disk storage system are controlled in operation by control signals generated by the control unit 329. The control signals include access control signals and internal clock signals. Typically, the control unit 329 comprises logic control circuits, storage means and a microprocessor. The control unit 329 generates control signals to control various system operations such as drive motor control signals on a line 323 and head position and seek control signals on a line 328. The control signals on the line 328 provide the desired current profiles to optimally move and position the slider 313 to the desired data track on the disk 312. Read and write signals are communicated to and from the read/write heads 321 by means of a recording channel 325. In the depicted embodiment, the read/write heads 321 incorporate a GMR sensor including a spin valve of the present invention.

Figure 4:
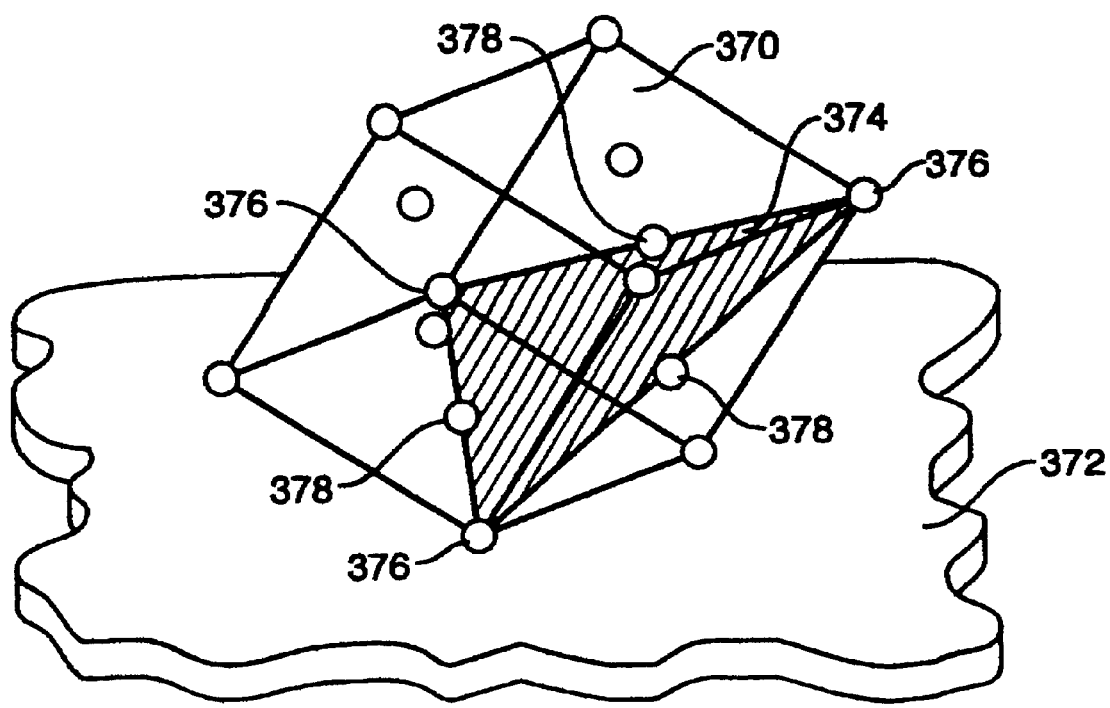
FIG. 4 is a perspective view of a microscopic portion of a face centered cubic (FCC) seed layer for an SV head according to the invention, with a (111) plane parallel to the substrate of the head.

Referring to FIG. 4, many of the materials used in the read/write heads 321 have an FCC, or Face-Centered Cubic, structure. It has been discovered that atoms in an FCC structure are most tightly and consistently arranged along the (111) crystallographic plane. Thus, the read/write head 321 functions optimally when the FCC materials in the read/write head 321 are oriented so that the (111) plane is parallel to the substrate. In FIG. 4, a cube-shaped sample 370 of FCC material is shown positioned over a substrate 372. The (111) plane 374 is positioned parallel to the substrate. Three corner atoms 376 and three face-centered atoms 378 within the cube-shaped sample 370 are located within the (111) plane 374, and are spaced apart relatively evenly, with small distances between adjacent atoms.

When the (111) plane 374 is exposed to form an interface for subsequent layers, the crystalline structures of the new layers are formed in alignment with that of the seed layer. Interfaces between layers have few discontinuities (misaligned sets of atoms) or interstices (open spaces where atoms should be). Consequently, the (111) plane 374 is an effective foundation for the growth of tightly bonded, even-textured layers.

Figure 1:
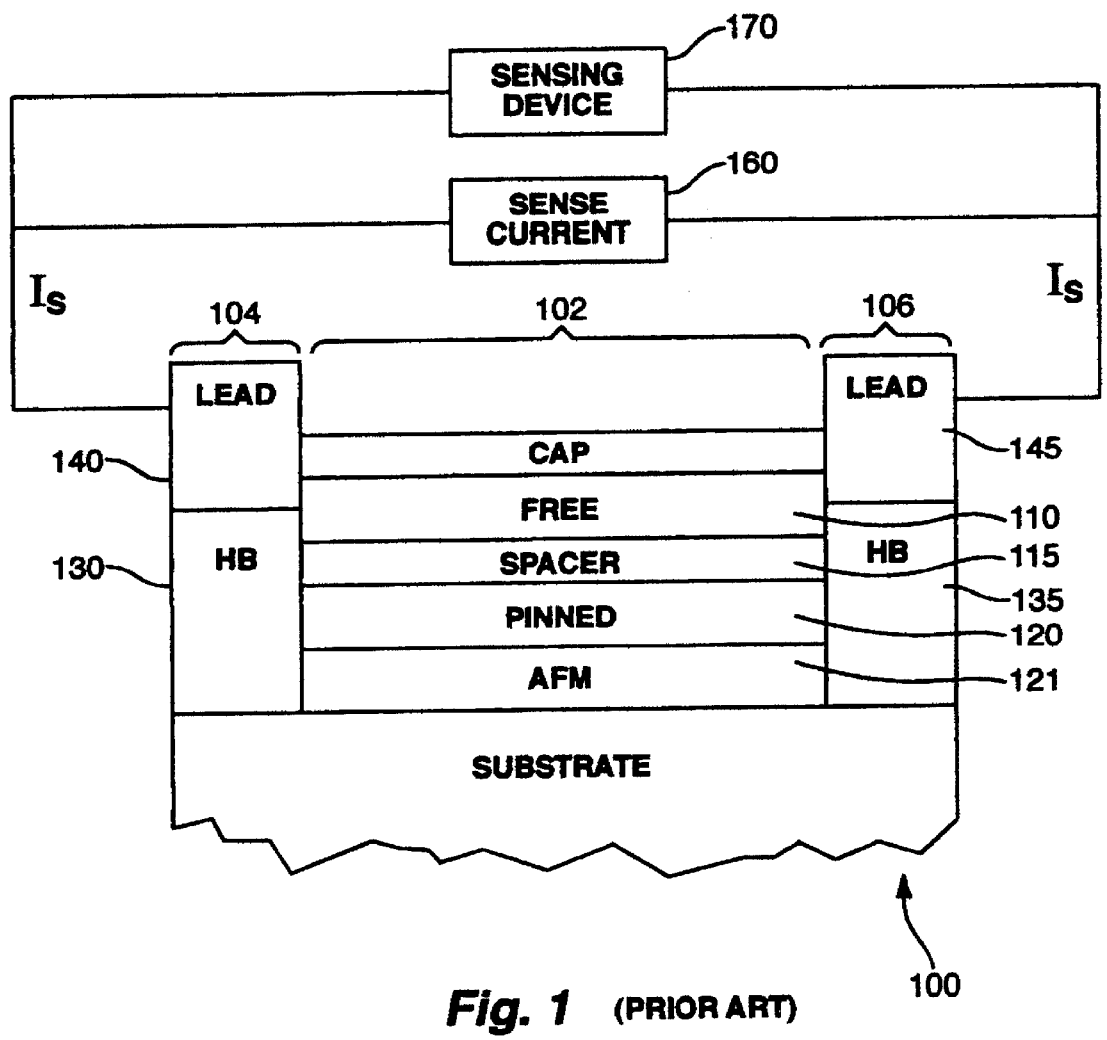
FIG. 1 is a cross-sectional view illustrating the composition of a spin valve sensor of the prior art.
Figure 2:
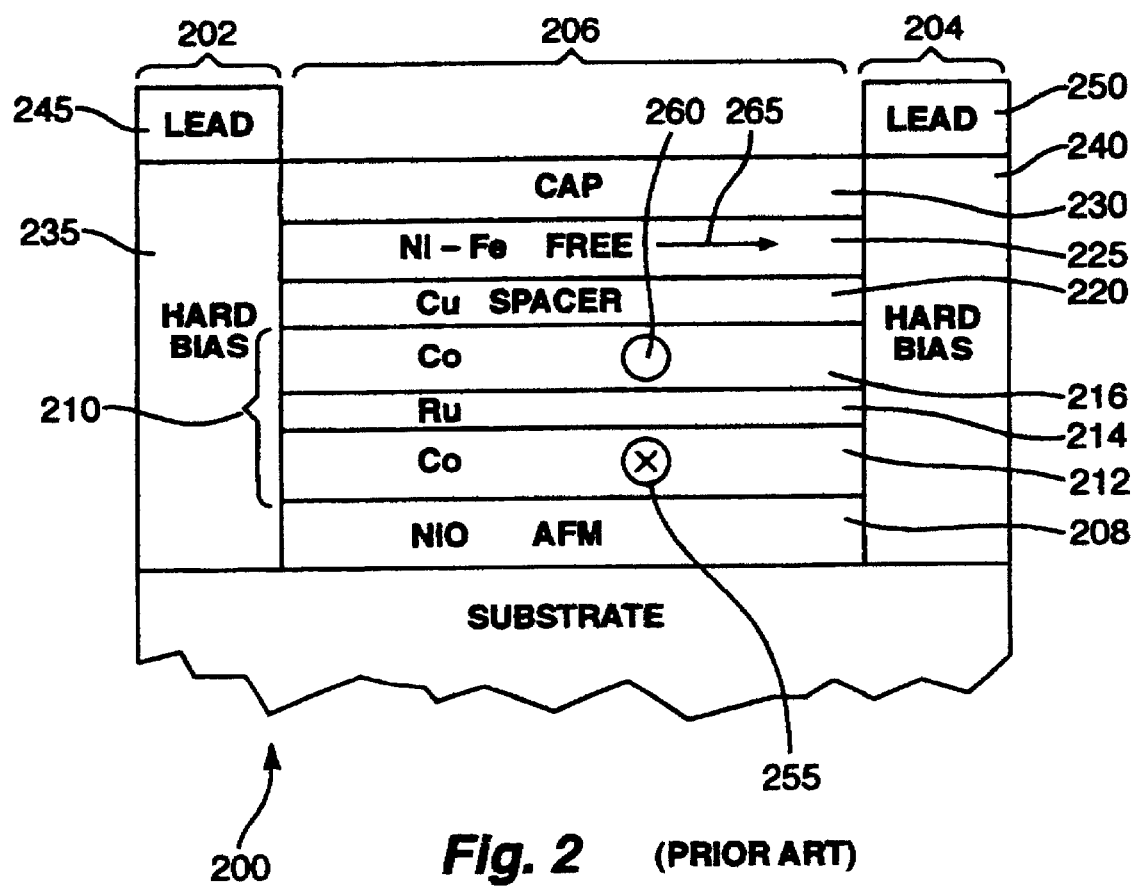
FIG. 2 is a cross-sectional view illustrating the composition of an AP-pinned spin valve sensor of the prior art.
Figure 5:
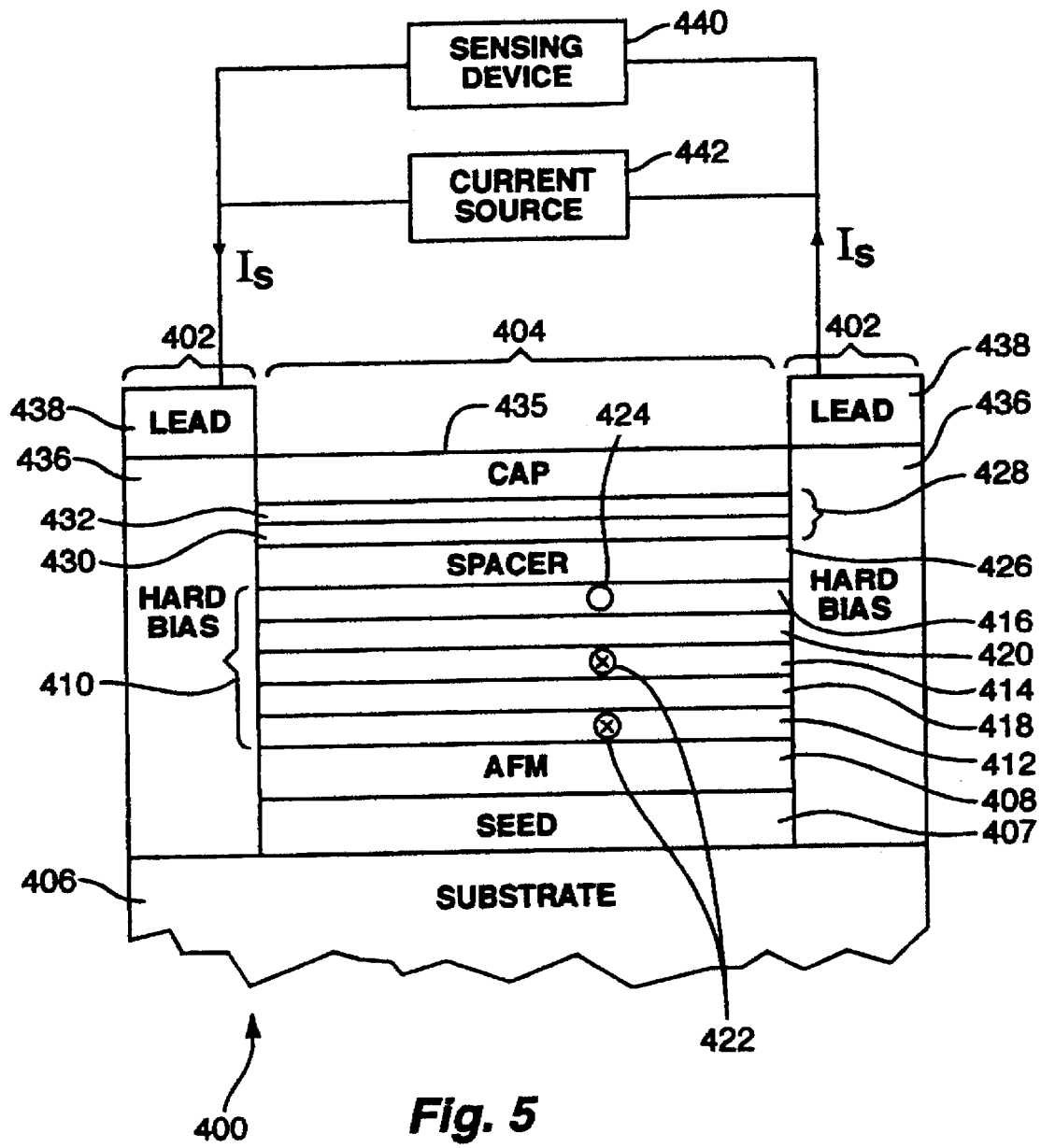
FIG. 5 is a cross-sectional view illustrating the composition of one embodiment of a spin valve sensor incorporating an improved seed layer according to the present invention.

FIG. 5 shows an air bearing surface (ABS) view of one embodiment of a spin valve 400, provided with an improved bottom structure according to the present invention. While an AP-pinned spin valve sensor 400 is depicted, and is preferred for use with the improved bottom structure of the present invention, nevertheless, the improved bottom structure of the present invention may also be used with other types of spin valve sensors, such as the simple spin valve sensor 100 of FIG. 1.

The spin valve sensor 400 of FIG. 5 is shown with a pair of end regions 402 separated from each other by a central region 404. The central region 404 has defined edges where the end regions 402 form a contiguous junction with and abut the edges. The sensor 400 is built upon a substrate 406, which may be any suitable substance, including glass, semiconductor material, or a ceramic material, such as alumina ($Al_2O_3$). The substrate 406 may also comprise a shield layer and a gap layer as is known to those skilled in the art. In the following description, "above" means further from the substrate 406, and "below" means closer to the substrate. Likewise, the "bottom" layers are those closest to the substrate 406, and the "top" layers are those furthest from the substrate 406.

A seed layer 407 is formed on top of the substrate 406. The seed layer 407 may be configured in a number of different ways according to the invention. The primary function of the seed layer 407 is to form a foundation for the growth of layers on top of it. Thus, it is preferred under the present invention that the materials used to form the seed layer 407 have an FCC structure that forms with a (111) plane parallel to the substrate 406, as described in connection with FIG. 4. It has been discovered that if the (111) plane of the seed layer 407 is parallel to the substrate 406, subsequent FCC layers formed over the seed layer 406 will form with a consistent crystalline structure and orientation. The seed layer 407 preferably has a thickness ranging from about 25 Å to about 185 Å, and a more preferred thickness of about 50 Å to about 80 Å.

An antiferromagnetic (AFM) layer 408 is preferably formed over the seed layer 407 in the central region 404. Alternatively, the AFM layer 408 may be formed in both the central region 404 as well as the end regions 402. The AFM layer 408 is, in one embodiment, formed of IrMn, with a thickness in a range of between about 40 Å and about 100 Å. A thickness in a range of between about 50 Å and about 80 Å is more preferable. A thickness of about 60 Å is most preferable for the IrMn embodiment.

Alternatively, in order to maintain better pinning at high temperatures, PtMn may be used to form the antiferromagnetic layer 408, and is preferably formed with a thickness in a range of between about 100 Å and about 300 Å. A range of between about 125 Å and about 225 Å is more preferable. A thickness of about 150 Å is most preferable for PtMn. The tradeoff involved in the use of PtMn is that the antiferromagnetic layer 408 must be thicker than IrMn when IrMn is used. Other materials, such as PtPdMn, NiO, NiMn, and CrPtMn, may also be used to form the antiferromagnetic layer 408, with similar tradeoffs.

A laminated anti-parallel (AP)-pinned layer 410 is shown formed over the AFM layer 408. In the depicted embodiment, the AP-pinned layer 410 comprises first, second, and third AP-pinned layers 412, 414, and 416, respectively. Alternatively, a single pinned layer, similar to layer 120 of FIG. 1 could be used in place of the laminated AP-pinned layer 410. In the depicted embodiment, the first and second AP-pinned layers 412 and 414 are separated from each other by a layer 418 that is preferably formed of a metallic material having a high resistivity. An anti-parallel coupling (APC) layer 420 is preferably formed of a non-magnetic material that allows the first and second AP-pinned layers 412 and 414 to be strongly coupled antiferromagnetically to the third AP-pinned layer 416.

The layer 418 may be formed of any suitably resistive material, such as NiFeNb, NiFeMo, and NiFeCr. However, NiFeNb is considered to be particularly effective due to a high electrical resistivity and a homogeneous FCC structure. Although any suitably nonmagnetic material may be used to form the anti-parallel coupling layer 420, Ru is preferred. The first, second, and third AP-pinned layers 412, 414, and 416, may be formed of suitable materials such as CoFe and Co. In the depicted embodiment, the first AP-pinned layer 412 is a layer of CoFe, which is deposited on and in contact with the AFM layer 408. The second and third AP-pinned layers 414 and 416 may also be formed of CoFe. The anti-parallel coupling layer 420 is formed between the second and third AP-pinned layers 414 and 416. Preferably, the first and second AP-pinned layers 412 and 414 are pinned in a direction 422 opposite the direction 424 of the third AP-pinned layer 416.

The entire pinned layer preferably has a thickness in a range of between about 34 Å and about 105 Å, and more preferably is about 56 Å. The first AP-pinned layer 412 preferably has a thickness in a range of between about 5 Å and about 25 Å, with a more preferred range of between about 8 Å and about 15 Å. A most preferred thickness is about 10 Å. It is preferred that the high resistivity layer 418 within the pinned layer 410 have a thickness falling within a range of between about 5 Å and about 15 Å. A thickness in a range of between about 6 Å and about 10 Å is more preferred. Most preferably, the high resistivity layer 418 is about 7 Å thick. The second AP-pinned layer 414 is preferably in a range of between about 5 Å and about 25 Å in thickness, with a more preferred range of between about 5 Å and about 15 Å, and a most preferred thickness of about 5 Å. The thickness of the anti-parallel coupling layer 420 is preferably in a range of between about 4 Å and about 10 Å, with a more preferred range of between about 6 Å and about 9 Å, and a most preferred value of about 8 Å.

The third AP-pinned layer 416 is preferably in a range of between about 15 Å and about 30 Å in thickness, with a more preferred range of between about 22 Å and about 28 Å, and a most preferred thickness of about 26 Å. The thicknesses of the first and third AP-pinned layers 412 and 416 must be simultaneously adjusted because the performance of the spin valve sensor 400 depends upon the difference between them. This difference, or the thickness of the first AP-pinned layer 412 subtracted from the thickness of the third AP-pinned layer 416, should be kept within a range of between about 3 Å and about 20 Å.

The spin valve sensor 400 as depicted also includes a spacer layer 426 formed over and in contact with the third AP-pinned layer 416. The spacer layer 426 is preferably formed of a GMR promoting material such as copper (Cu), although it may also be formed of other GMR promoting materials such as gold (Au) or silver (Ag). The thickness of the spacer layer 426 is important to the invention, and is preferably in a range of between about 15 Å and about 30 Å with a more preferred range comprising about 18 Å and about 25 Å, and a most preferred value of about 21 Å.

A free ferromagnetic layer 428 is shown formed over and adjacent to the spacer layer 426. In order to provide the advantages of the present invention, the free ferromagnetic layer 428 is preferably formed with a material having a high degree of magnetoresistance. One example of such a material is a Co—Fe alloy. Preferably, the free ferromagnetic layer 428 maintains magnetic softness $H_k$ with a structure in which the Co—Fe alloy of the free layer 428 is laminated with a second material. In the depicted embodiment, the free layer 428 is formed with a resistive layer 430 of CoFe and a lamination layer 432 formed from NiFe, which is selected for its high magnetoresistance and low magnetostriction. The lamination layers 430 and 432 of CoFe and NiFe assist in achieving magnetic softness.

Preferably, the free layer 428 has a total thickness in a range of between about 25 Å and about 75 Å. A thickness in a range of between about 35 Å and about 55 Å is more preferable. A thickness of about 45 Å is most preferred. Accordingly, the resistive layer 430 is preferably in a range of between about 5 Å and about 15 Å in thickness, with a more preferred range of about 10 Å to about 15 Å, and a most preferred thickness of about 15 Å. Furthermore, the lamination layer 432 is preferably formed with a thickness in a range of from between about 20 Å and about 60 Å. A more preferred range is between about 25 Å and about 40 Å. A most preferred thickness is about 30 Å.

The lamination layer 432 may be comprised of materials in addition to the preferred Ni—Fe alloy. For example, the addition of Co to the Ni—Fe alloy has been found to substantially increase the overall magnetoresistance of the free layer 428, while not substantially decreasing the magnetic hardness $H_K$ of the free layer 428. Materials such as chromium, tantalum, rhodium, and molybdenum, may also be added to the Ni—Fe alloy to increase resistance of the lamination layer 432, and thereby enhance the amount of current passing through the resistive layer 430.

Referring again to FIG. 5, the spin valve sensor 400 is shown with a cap layer 435 formed over the free layer 428 to protect the material deposited in the central region 404 against oxidation. The cap layer 435 is preferably made of tantalum (Ta), but of course, any suitable material may be used. The spin valve sensor 400 is also shown formed with a pair of longitudinal biasing layers 436, formed in the end regions 402. The biasing layers 436 are preferably made of hard material such as Co—Pt—Cr alloy and are used for longitudinally biasing the central region 404.

A pair of electrical leads 438 are also shown formed over the biasing layers 436 and are employed to form a circuit path between the spin valve sensor 400, a current source 442, and a sensing device 440. In the preferred embodiment, the sensing device 440 detects the voltage signal between the two leads 402, which changes with the changing magnetic signals on the disk.

The sensed voltage signal arises from a change in resistance, ΔR, of the central portion 404 as the magnetization direction $M_F$ of the free layer 428 rotates in response to the applied magnetic signal from the recorded medium. The sensing device may include a digital recording channel such as a partial-response maximum likelihood (PRML) channel as is known to those skilled in the art. Alternatively, the sensing device may include a peak-detect channel as is known to those skilled in the art. In one embodiment, the sensing device includes a digital recording channel of PRML type.

Figure 6A:
FIGS. 6(a) and 6(b) are cross-sectional views illustrating layers that may form the improved seed layer shown in FIG. 5.

Referring to FIG. 6(a), the seed layer 407 may itself be formed of a plurality of layers. In the depicted example, a bottom layer 510 may rest directly on the substrate 406, with a texturing layer 530 resting on top of the bottom layer 510 to control the textures of layers formed above the seed layer 407. The texturing layer 530 is preferably formed of a material having a face-centered cubic (FCC) crystalline structure, and it is also considered advantageous to form the texturing layer 530 from a material which causes the (111) plane of the crystalline structure to form parallel to the substrate 406. NiFeNb is most preferred, although other materials with suitable characteristics may be used, and may include NiFeMo and NiFeCr.

The bottom layer 510 preferably has a structure compatible with both the substrate 406 and the texturing layer 530. Compatible structures typically have similar crystalline structures, crystal orientations, and lattice constants. The lattice constant of a crystalline material is defined as the smallest distance between adjacent atoms in a crystal. Similar lattice constants permit the crystals of adjacent layers to align with each other to produce a homogeneous grain boundary with few irregularities. Thus, the bottom layer 510 should preferably also have an FCC crystalline structure with the (111) plane parallel to the substrate 406. In addition, it is desirable for the bottom layer 510 to have a lattice constant similar to those of the substrate 406 and the texturing layer 530. Although NiO is the preferred from which to form the bottom layer 510, other suitable materials, such as NiMnO, may also be used.

Configured in this fashion, the bottom layer 510 preferably has a thickness in a range of between about 20 Å and about 100 Å. More preferably, the bottom layer 510 has a thickness in a range of between about 30 Å and about 70 Å. The bottom layer 510 should most preferably have a thickness of about 40 Å. The texturing layer 530 is preferably in a range of between about 5 Å and about 30 Å in thickness. The thickness of the texturing layer 530 is more preferably in a range of between about 7 Å and about 20 Å. Most preferably, the texturing layer 530 is about 10 Å thick.

Figure 6B:
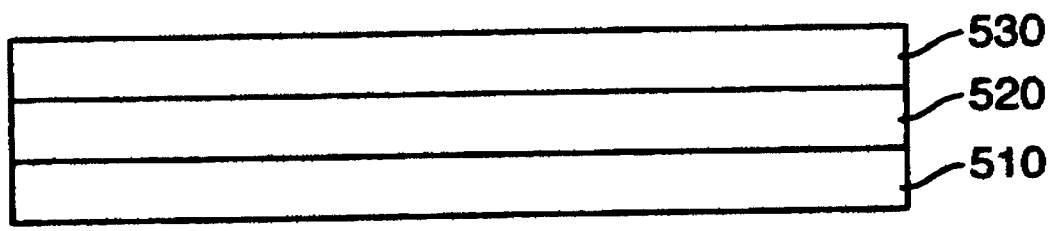

Referring to FIG. 6(b), shown therein is an alternative embodiment of the seed layer 407 of FIG. 5. A transition layer 520 is shown inserted between the bottom layer 510 and the texturing layer 530. The transition layer 520 may ease the transition between the bottom layer 510 and the texturing layer 530, and may provide a more suitable foundation for the antiferromagnetic layer 408. In one example, the antiferromagnetic layer 408 is formed of PtMn, and a transition layer 520 is preferably included to permit better formation of the thick antiferromagnetic layer 408. Ta is a preferred material for use in forming the transition layer 530, however, other suitable materials, such as Zr, may also be used.

The thicknesses of the bottom layer 510 and the texturing layer 530, as configured in this embodiment, are preferably as described in connection with the previous embodiment. The thickness of the transition layer 520 preferably falls within a range of between about 20 Å and about 60 Å. More preferably, the transition layer 520 is in a range of between about 25 Å and about 45 Å in thickness. The transition layer 520 of this embodiment is most preferably about 30 Å thick.

Figure 7:
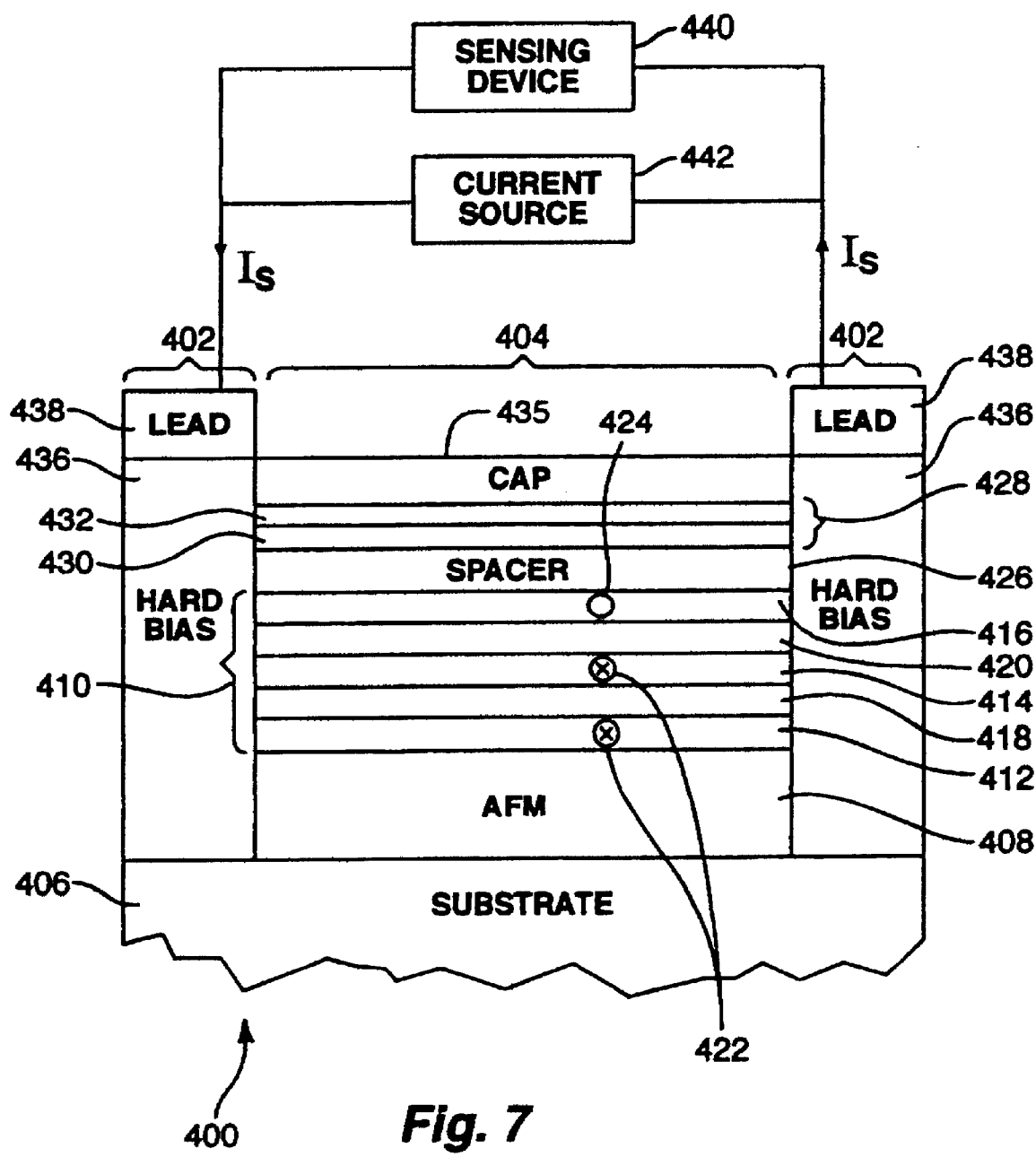
FIG. 7 is a cross-sectional view illustrating the composition of one embodiment of a spin valve sensor incorporating an improved pinned layer according to the present invention.

Referring to FIG. 7, shown therein is an alternative embodiment of a GMR sensor of the present invention. In the embodiment of FIG. 7, the seed layer 407 is omitted. The high resistivity layer 418 remains, and may be configured as described in connection with FIG. 5. The antiferromagnetic layer 408, in this configuration, is preferably formed of NiO, although other materials may be used to carry out the pinning function of the antiferromagnetic layer 408. The remaining layers and components may be formed as described in connection with FIG. 5.

The high resistivity layer 418 and the seed layer 407 may provide special synergies when utilized together. The combination of high resistivity buffering, even texture growth, and high exchange coupling may lead to a uniquely high GMR coefficient. The embodiment of FIG. 7 illustrates that the high resistivity layer 418 may function in the absence of a seed layer 407. Similarly, the seed layer 407 may also function in embodiments in which the pinned layer 410 includes no high resistivity layer 418.

Preferred alloys and concentrations for the present invention may be as follows. A currently preferred example of the Co—Fe alloy for use in the first, second, and third AP-pinned layers 412, 414, 416, and the resistive layer 430, is $Co_{90}Fe_{10}$. A preferred example of the Ni—Fe alloy for use in the lamination layer 432 is $Ni_{81}Fe_{19}$. A preferred example of the Ni—Fe alloy, for use in the high resistivity layer 418 or the texturing layer 530, is $Ni_{42}Fe_{50}Nb_8$; portions of Ni and Fe may be altered but preferably remain nearly equal and larger than the portion of Nb.

A preferred example of the Ni alloy, for use in the antiferromagnetic layer 408 or the bottom layer 510, is $Ni_{50}O_{50}$. A preferred example of the IrMn, for use in the antiferromagnetic layer 408, is $Ir_{25}Mn_{75}$; the portion of Ir may vary between about 20% and about 25%, and the portion of Mn may similarly vary between about 75% and about 80%. A preferred example of the PtMn, for use in the antiferromagnetic layer 408, is $Pt_{40}Mn_{60}$. The portion of Pt may vary between about 40% and about 50%, and the portion of Mn may similarly vary between about 50% and about 60%.

From the above-discussion, it should be readily apparent that the improved bottom spin valve structure of the present invention improves the GMR coefficient, and therefore the measuring sensitivity of the spin valve. Improved seed and high resistivity layers enhance the measurable resistance changes of the free layer by improving layer textures, increasing the magnetic softness of the free layer, enhancing the coupling between layers, and reducing current shunting.

The present invention may be embodied in other specific forms without departing from its essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A spin valve sensor, comprising:
   a substrate;
   a seed layer positioned above the substrate, the seed layer comprising a first layer comprising a NiFe alloy and a second layer comprising a Ni alloy; and a third layer between the first and second layers, the third layer containing a metal selected from the group consisting of Ta and Zr; and
   a free layer of a ferromagnetic material positioned above the seed layer.

2. The spin valve sensor of claim 1, wherein the first layer comprises NiFeX, where X is selected from the group consisting of Nb, Mo, and Cr.

3. The spin valve sensor of claim 1, wherein the second layer is positioned between the first layer and the substrate.

4. The spin valve sensor of claim 1, wherein the seed layer further comprises a face centered cubic (fcc) material selected to form a (111) crystallographic plane situated substantially parallel to the substrate.

5. The spin valve sensor of claim 1, wherein the second layer comprises NiO.

6. The spin valve sensor of claim 1, wherein the first layer has a thickness in the range of between about 5 Angstroms and about 30 Angstroms, and the second layer has a thickness of between about 20 Angstroms and about 100 Angstroms.

7. The spin valve sensor of claim 1, wherein the third layer comprises Ta.

8. The spin valve sensor of claim 7, wherein the third layer has a thickness of between about 20 Angstroms and about 60 Angstroms.

9. The spin valve sensor of claim 1, further comprising a pinned layer positioned between the seed layer and the free layer, the pinned layer comprising a layer of a resistive material selected to reduce the amount of current traveling from the pinned layer to the antiferromagnetic layer.

10. The spin valve sensor of claim 9, wherein the pinned layer comprises NiFeX, where X is chosen from the group consisting of Nb, Mo, and Cr.

11. The spin valve sensor of claim 10, wherein the pinned layer comprises NiFeNb.

12. A spin valve sensor, comprising:
    a substrate;
    a seed layer positioned above the substrate, the seed layer comprising a first layer, a second layer and a third layer;
    the first layer comprising NiFeX, where X is chosen from the group consisting of Nb, Mo, and Cr;
    the second layer comprising a Ni alloy; the third layer, between the first and second layers, containing a metal selected from the group consisting of Ta and Zr;
    an antiferromagnetic (AFM) layer positioned above the seed layer;
    a pinned layer formed of a ferromagnetic material and positioned above the antiferromagnetic layer; and
    a free layer of a ferromagnetic material positioned above the pinned layer.

13. The spin valve sensor of claim 12, wherein the pinned layer further comprises a first antiparallel-pinned layer adjacent to the antiferromagnetic layer, the first anti-parallel pinned layer comprising a material selected from the group consisting of CoFe and Co.

14. The spin valve sensor of claim 13, wherein the pinned layer further comprises a second antiparallel-pinned layer positioned above the first antiparallel-pinned layer, the second anti-parallel pinned layer comprising a material selected from the group consisting of CoFe and Co.

15. The spin valve sensor of claim 14, wherein the layer of electrically resistive material is positioned between and adjacent to the first and second antiparallel-pinned layers.

16. The spin valve sensor of claim 12, wherein the layer of electrically resistive material comprises a material chosen from the group consisting of NiFeX, where X is selected from the group consisting of Nb, Mo, and Cr.

17. The spin valve sensor of claim 16, wherein the layer of electrically resistive material comprises NiFeNb.

18. The spin valve sensor of claim 17, wherein the layer of electrically resistive material has a thickness of between about 5 Angstroms and about 15 Angstroms.

19. The spin valve sensor of claim 18, wherein the first and second antiparallel-pinned layers each have a thickness of between about 5 Angstroms and about 20 Angstroms.

20. A disk drive system, comprising:
    a magnetic recording disk;
    an anti-parallel-pinned spin valve sensor for reading data recorded on the recording disk, the sensor comprising:
        a substrate;
        a seed layer positioned above the substrate, the seed layer comprising:
            a first layer comprising NiFeX, where X is chosen from the group consisting of Nb, Mo, and Cr; and
            a second layer positioned between the first layer and the substrate, the second layer comprising a Ni alloy;
        an antiferromagnetic (AFM) layer positioned above the seed layer;
        a pinned layer of a ferromagnetic material positioned above the antiferromagnetic layer, the magnetic orientation of the pinned layer being substantially fixed;

a spacer layer positioned above the pinned layer;

a free layer of a ferromagnetic material positioned above the spacer layer, the free layer configured to have an electrical resistance that changes in response to changes in magnetic flux through the free layer; and a cap layer positioned above the free layer;

an actuator for moving the spin valve sensor across the magnetic recording disk in order for the spin valve sensor to access different magnetically recorded data on the magnetic recording disk; and a detector electrically coupled to the spin valve sensor and configured to detect changes in a resistance of the sensor caused by rotation of the magnetization axis of the free ferromagnetic layer relative to the fixed magnetizations of the antiparallel-pinned layer in response to changing magnetic fields induced by the magnetically recorded data.

21. The spin valve sensor of claim 20, wherein the first layer comprises NiFeNb and the second layer comprises NiO.

22. The spin valve sensor of claim 20, wherein the first layer has a thickness of between about 5 Angstroms and about 30 Angstroms, and the second layer has a thickness of between about 20 Angstroms and about 100 Angstroms.

23. The spin valve sensor of claim 20, wherein the pinned layer further comprises a layer of electrically resistive material selected to reduce the amount of current traveling from the pinned layer to the antiferromagnetic layer.

* * * * *

UNITED STATES PATENT AND TRADEMARK OFFICE
CERTIFICATE OF CORRECTION

PATENT NO.     : 6,650,512 B1
DATED          : November 18, 2003
INVENTOR(S)    : Hardayal Singh Gill Page 1 of 1

It is certified that error appears in the above-identified patent and that said Letters Patent is hereby corrected as shown below:

<u>Column 4,</u>
Line 22, "Therefore, It" should read -- Therefore, it --.

<u>Column 7,</u>
Line 21, "layer 406" should read -- layer 407 --.
Line 52, "place ofthe" should read -- place of the --.

<u>Column 10,</u>
Line 32, "layer 530," should read -- layer 520, --.

<u>Column 11,</u>
Line 23, "softness ofthe" should read -- softness of the --.

Signed and Sealed this

Twenty-seventh Day of April, 2004

JON W. DUDAS
*Acting Director of the United States Patent and Trademark Office*